United States Patent
Qian et al.

(10) Patent No.: US 10,793,422 B2
(45) Date of Patent: Oct. 6, 2020

(54) MICROELECTROMECHANICAL SYSTEMS PACKAGES AND METHODS FOR PACKAGING A MICROELECTROMECHANICAL SYSTEMS DEVICE

(71) Applicant: VANGUARD INTERNATIONAL SEMICONDUCTOR SINGAPORE PTE. LTD., Singapore (SG)

(72) Inventors: You Qian, Singapore (SG); Humberto Campanella Pineda, Singapore (SG); Rakesh Kumar, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/221,683

(22) Filed: Dec. 17, 2018

(65) Prior Publication Data
US 2020/0189909 A1    Jun. 18, 2020

(51) Int. Cl.
| H01L 21/00 | (2006.01) |
| B81B 7/00 | (2006.01) |
| B81B 7/02 | (2006.01) |
| B81C 1/00 | (2006.01) |

(52) U.S. Cl.
CPC ............. *B81B 7/0077* (2013.01); *B81B 7/02* (2013.01); *B81C 1/00047* (2013.01); *B81C 1/00333* (2013.01); *B81B 2203/0307* (2013.01); *B81B 2203/0315* (2013.01); *B81B 2203/04* (2013.01); *B81B 2207/094* (2013.01); *B81C 2203/0172* (2013.01)

(58) Field of Classification Search
CPC .... B81C 1/00047; B81C 1/00333; B81B 7/02
See application file for complete search history.

(56) References Cited

U.S. PATENT DOCUMENTS

| 7,248,131 B2 | 7/2007 | Fazzio et al. | |
|---|---|---|---|
| 7,615,395 B2 | 11/2009 | Heuvelman | |
| 7,684,104 B2* | 3/2010 | Chui | B81B 3/007 |
| | | | 359/290 |
| 8,569,091 B2* | 10/2013 | Anderson | H01L 21/302 |
| | | | 438/52 |
| 8,680,944 B2 | 3/2014 | Ye et al. | |
| 9,187,311 B2* | 11/2015 | Yamazaki | H01G 5/18 |
| 2004/0188785 A1* | 9/2004 | Cunningham | B81C 1/0015 |
| | | | 257/415 |
| 2007/0024391 A1 | 2/2007 | Sul et al. | |
| 2013/0032385 A1 | 2/2013 | Lin et al. | |
| 2016/0289064 A1* | 10/2016 | Lee | H01L 21/56 |
| 2017/0313577 A1 | 11/2017 | Pineda et al. | |
| 2019/0372543 A1 | 12/2019 | Qian et al. | |

\* cited by examiner

*Primary Examiner* — Laura M Menz
(74) *Attorney, Agent, or Firm* — Winston Hsu

(57) ABSTRACT

A microelectromechanical systems (MEMS) package may include a wafer having a MEMS device; a metal cap partially anchored to the wafer where at least one point between the cap and the wafer is unanchored, the metal cap at least substantially extending over the MEMS device; an electrical contact pad electrically coupled to the MEMS device; and a sealing layer disposed over the metal cap and the wafer, such that the sealing layer seals a gap between an unanchored portion of the metal cap and the wafer to encapsulate the MEMS device; wherein the electrical contact pad and the metal cap include the same composition.

9 Claims, 8 Drawing Sheets

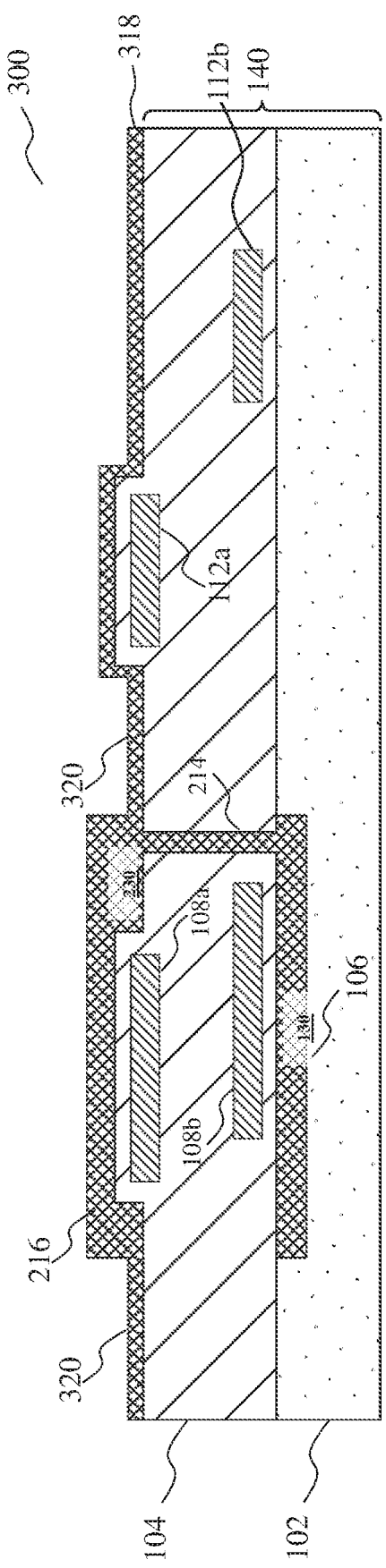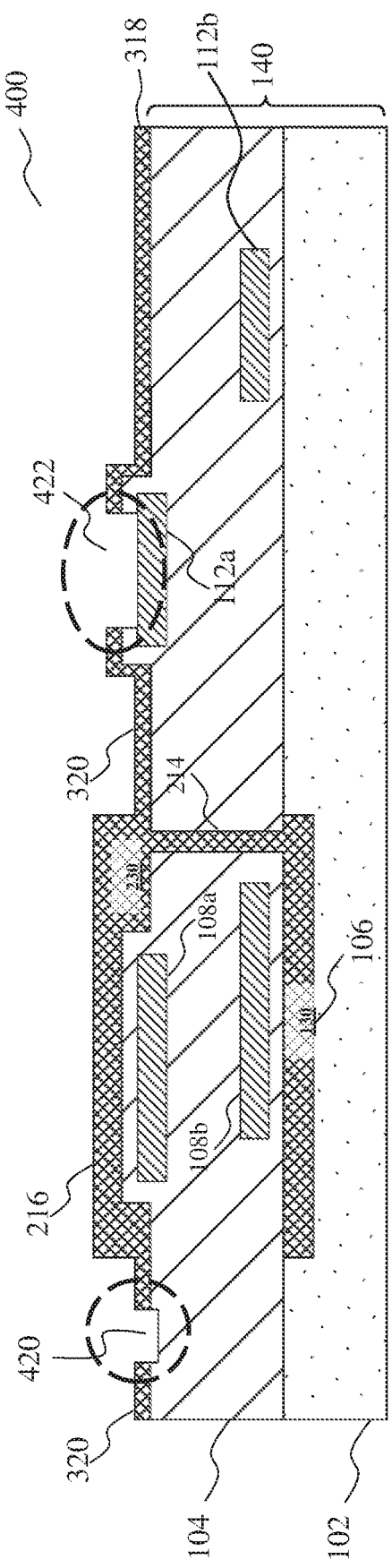
FIG. 3
FIG. 4

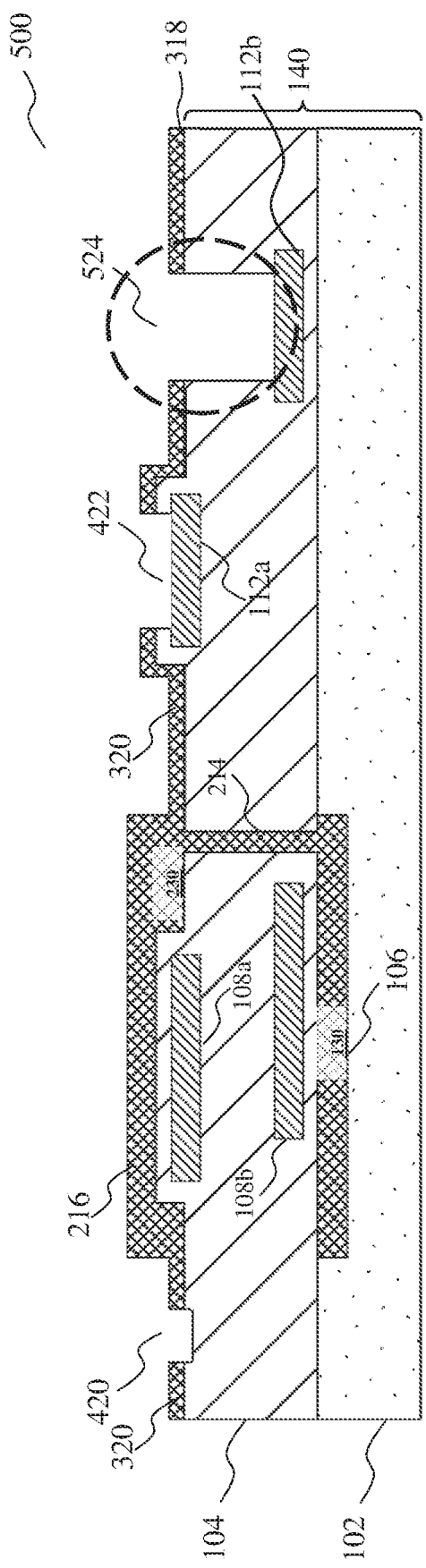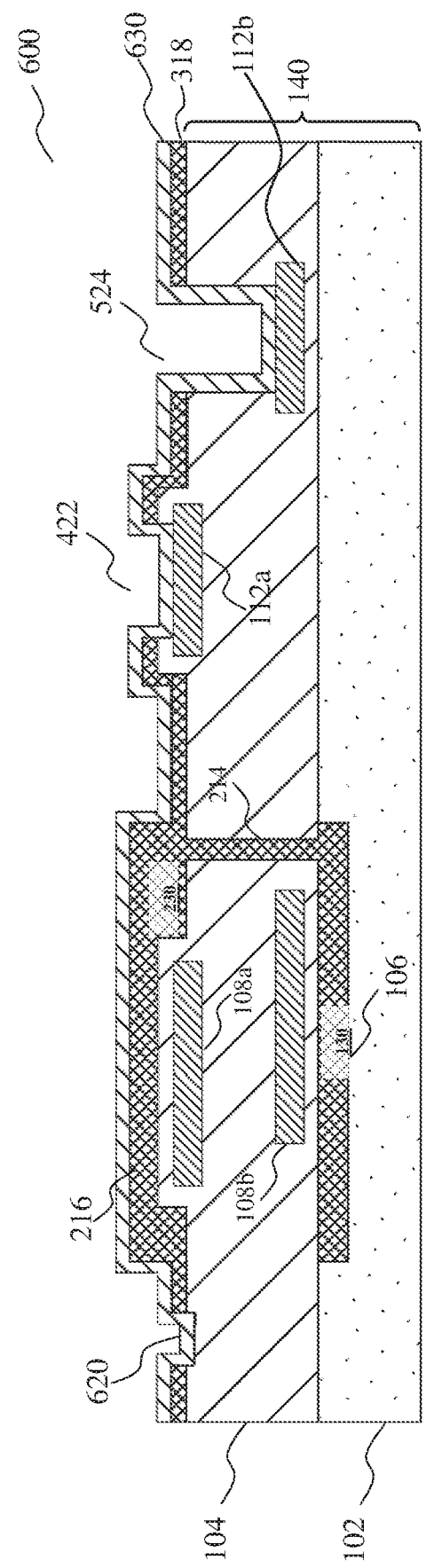

1300

1302 — Provide a metal cap that is partially anchored to a wafer comprising the MEMS device 1304 — Electrically couple an electrical contact pad to the MEMS device 1306 — Provide a sealing layer over the metal cap and the wafer such that the sealing layer seals a gap between an unanchored portion of the metal cap and the wafer to encapsulate the MEMS device

FIG. 13

MICROELECTROMECHANICAL SYSTEMS PACKAGES AND METHODS FOR PACKAGING A MICROELECTROMECHANICAL SYSTEMS DEVICE

TECHNICAL FIELD

Various embodiments relate to microelectromechanical systems (MEMS) packages and methods for packaging a MEMS device.

BACKGROUND

Wafer level packaging (WLP) is a popular method for packaging MEMS devices, as it allows the MEMS package to have a small form factor, and also allows the processes of wafer fabrication, packaging, testing and burn-in to be conducted under one production floor. A commonly employed WLP technique is wafer level capping. Wafer level capping involves bonding a cap wafer onto a device wafer. The resultant MEMS packages typically have form factors in the range of 200 um to 250 um. MEMS manufacturers are facing increased pressure to reduce the form factor of MEMS packages to less than 200 um in thickness. Also, there is a need to shield the MEMS devices from electromagnetic (EM) interference, especially in view of the increasing density of circuits in electronic devices. Currently there is no integrated WLP solution that can encapsulate MEMS devices while also providing EM shielding, unless additional processes are introduced to form a separate EM shield in the MEMS package.

SUMMARY

According to various non-limiting embodiments, there may be provided a MEMS package including: a wafer having a MEMS device; a metal cap partially anchored to the wafer where at least one point between the cap and the wafer is unanchored, the metal cap at least substantially extending over the MEMS device; an electrical contact pad electrically coupled to the MEMS device; and a sealing layer disposed over the metal cap and the wafer, such that the sealing layer seals a gap between an unanchored portion of the metal cap and the wafer to encapsulate the MEMS device; wherein the electrical contact pad and the metal cap include the same composition.

According to various non-limiting embodiments, there may be provided a method for packaging a MEMS device. The method may include: providing a metal cap that is partially anchored to a wafer including the MEMS device where at least one point between the cap and the wafer is unanchored, the metal cap arranged to at least substantially extend over the MEMS device; electrically coupling an electrical contact pad to the MEMS device; and providing a sealing layer over the metal cap and the wafer such that the sealing layer seals a gap between an unanchored portion of the metal cap and the wafer to encapsulate the MEMS device; wherein the electrical contact pad and the metal cap include the same composition.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIGS. 1-10 illustrate a method for packaging a MEMS device according to various non-limiting embodiments through a series of simplified cross-sectional views.

FIG. 13 illustrates a flow diagram of a method for packaging a MEMS device according to various non-limiting embodiments.

DESCRIPTION

Figure 1:
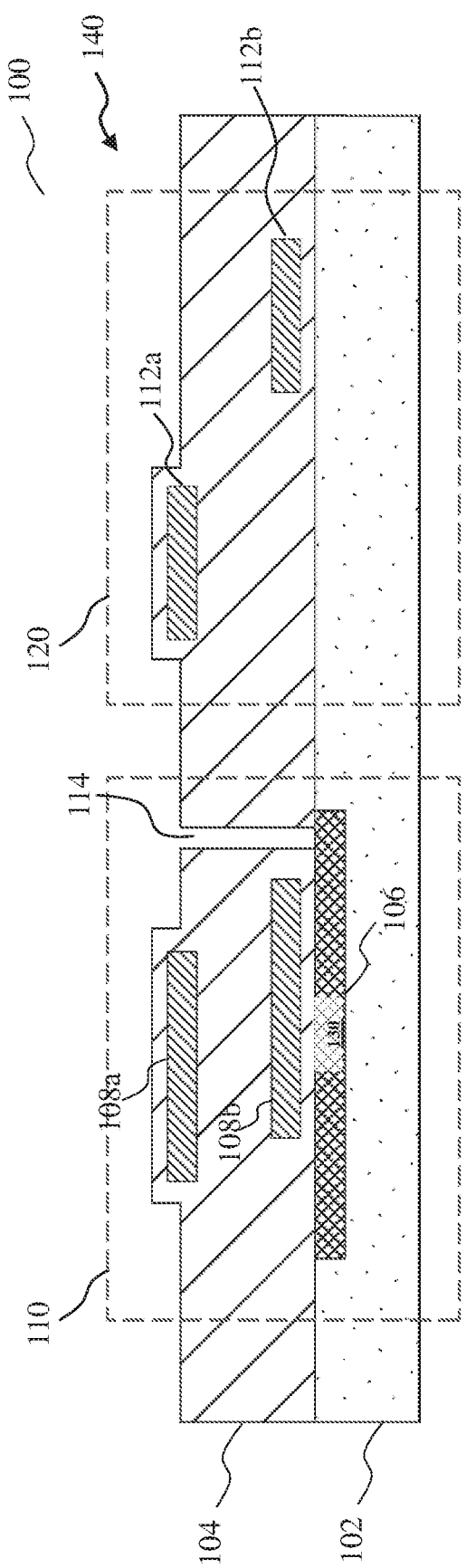

Embodiments described below in context of the MEMS packages are analogously valid for the respective methods, and vice versa. Furthermore, it will be understood that the embodiments described below may be combined, for example, a part of one embodiment may be combined with a part of another embodiment.

It will be understood that any property described herein for a specific MEMS package may also hold for any MEMS package described herein. It will be understood that any property described herein for a specific method may also hold for any method described herein. Furthermore, it will be understood that for any MEMS package or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

According to various embodiments, a method for packaging a MEMS device may be a wafer-level packaging method that is able to provide the MEMS device with an integrated electromagnetic shield, while reducing the number of process steps. By using wafer-level packaging, instead of other packaging methods like wafer cap packaging, the method may allow for the MEMS package to be small in form factor, for example, less than 150 um in thickness. The method may also add robustness to the MEMS package. The method may also allow for thin-film encapsulation to the MEMS device. The encapsulation may include a metal cap, which shields the MEMS device from electromagnetic (EM) interference. The method may include forming the metal cap and redistribution layer (RDL) in the same process steps, such that no additional process steps are required to form the EM shield. The method may include forming a lateral release via, for releasing sacrificial material to form cavities in the MEMS device. The method may offer the advantages of a faster, cheaper, and safer process of releasing sacrificial material to form cavities in the MEMS device. Also, using a lateral release via instead of a vertical release via may save space in the device footprint. Unlike a MEMS package with a vertical release via where the MEMS device cannot be positioned directly underneath the vertical release via; by using a lateral release via, the MEMS device need not be offset in position relative to the release via. The method may allow for only one mask that is dedicated to the packaging process. In other words, only one additional mask as compared to a MEMS device fabrication process, for encapsulating the MEMS device may need to be used with the method described in more detail, below.

FIGS. 1-10 illustrate a method for packaging a MEMS device according to various non-limiting embodiments through a series of simplified cross-sectional views.

FIG. 1 illustrates a non-limiting process 100. The process 100 may include providing a device wafer 140. The device wafer 140 may include a MEMS device 110 and a contact area 120. The portion of the device wafer 140 that houses the MEMS device 110 may be referred herein as the device area. The contact area 120 may house electrical contact points 112a, 112b for the MEMS device 110. The electrical contact points 112a, 112b may be electrically coupled to the MEMS device 110. For example, the MEMS device 110 may include at least one electrode 108a, 108b, and the electrical contact points 112a, 112b may be connected to the at least one electrode 108a, 108b. In a non-limiting embodiment, there may be more than two electrodes; although two electrodes are depicted in FIG. 1. The device wafer 140 may include a substrate 102 and an active region 104. The substrate 102 may include, for example, silicon or glass. The substrate 102 may also include integrated circuits, for example, may be a CMOS device wafer. The active region 104 may be arranged over the substrate 102. The active region 104 may include electrodes 108a, 108b of the MEMS device 110. The upper electrical contact point 112a in the contact area 120 may be formed in the same layer, and of the same material, as the upper electrode 108a. Similarly, the lower electrical contact point 112b in the contact area 120 may be formed in the same layer, and of the same material, as the lower electrode 108b. The electrodes 108a, 108b, and the electrical contact points 112a, 112b may be formed from electrically conductive material, for example at least one of molybdenum (Mo), tungsten (W), aluminum (Al), platinum (Pt), other suitable metals, or combinations thereof.

The active region 104 may include a moveable member, for example, a flexible membrane, that may convert electrical energy to kinetic energy. The moveable member may be for example, a piezoelectric transducer or a capacitive transducer. The active region 104 may include a piezoelectric material, such as at least one of aluminum nitride (AlN), scandium-doped AlN (ScAlN), lithium niobate (LiNbO$_3$), lithium tantalate (LiTa$_2$O$_3$), zinc oxide (ZnO), lead zirconate titanate (PZT), polyvinylidene fluoride (PVDF), any other thin-film piezoelectric material, or combinations thereof. The active region 104 may also, or alternatively, include silicon. A lower sacrificial member 106 may be embedded in the substrate 102 such that it comes into contact with the active region 104. The lower sacrificial member 106 may define a space that will subsequently form a lower cavity underneath the active region 104 within the device area. The lower sacrificial member 106 may include, or may be formed from but is not limited to, any one of silicon dioxide (SiO$_2$), silicon nitride (SiN), tungsten (W), Molybdenum (Mo), aluminum nitride (AlN), aluminum oxide (Al$_2$O$_3$), or a combination of at least one of these materials. The device area may include a vertical via 114 that extends from a top surface of the active region 104 to a bottom surface of the active region 104 that is in contact with the substrate 102. The bottom surface is opposite to the top surface. The vertical via 114 exposes the lower sacrificial member 106.

The process 100 may include etching the substrate 102 to form an area defining a lower cavity of the MEMS device 110. The process 100 may further include depositing a first sacrificial material 130 into the area to form the lower sacrificial member 106. The process 100 may optionally include depositing a seed layer over the substrate 102. The process 100 may include depositing a bottom metal layer, and then patterning the bottom metal layer to form the lower electrode 108b and the lower electrical contact point 112b. The process 100 may include depositing an active material, such as a piezoelectric material or silicon, over the bottom metal layer to form the moveable member. The process 100 may include depositing a top metal layer, and then patterning the top metal layer to form the upper electrode 108a and the upper electrical contact point 112a. The process 100 may further include depositing more of the active material over the top metal layer, and then etching the active material to reach the lower sacrificial member 106, thereby forming the vertical via 114.

Figure 2:
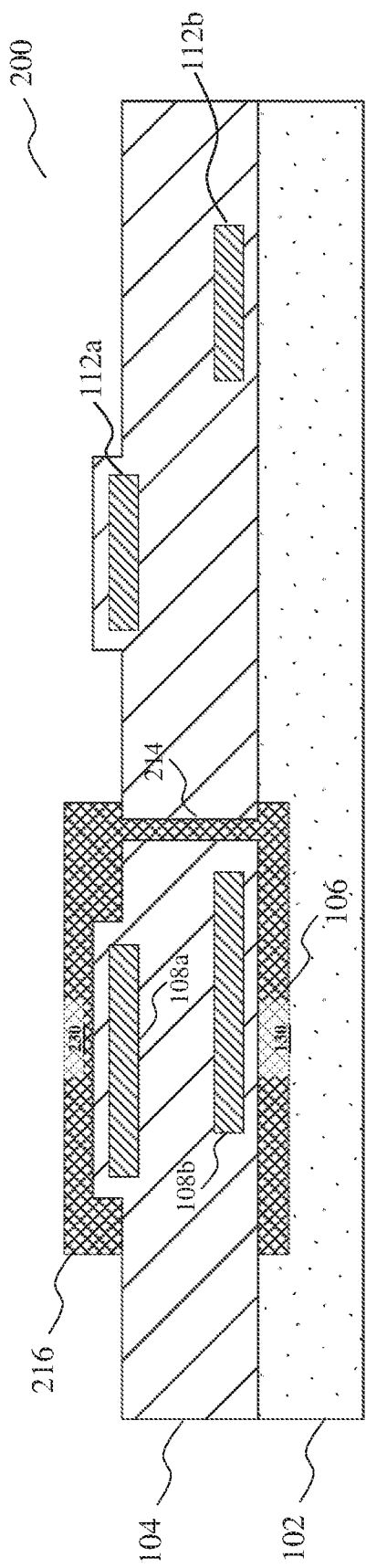

FIG. 2 illustrates a non-limiting process 200. The process 200 may include depositing a layer of second sacrificial material 230 over the device wafer 140. The second sacrificial material 230 may be identical in composition as the first sacrificial material 130, or may consist of any other material that can be released together with the lower sacrificial member 106 using the same etching solution. The second sacrificial material 230 may include, or may be, a dielectric material in a non-limiting embodiment. The second sacrificial material 230 may enter the vertical via 114 to form a sacrificial pillar 214. The process 200 may further include etching the second sacrificial material 230 using a first mask, to form an encasing member 216. The first mask may be the only mask in the method according to various non-limiting embodiments that is in addition to the standard process of fabricating the MEMS device 110. In other words, the first mask may be the only mask in the method that is used solely for the purpose of packaging the MEMS device 110. The encasing member 216 may define a space that will subsequently form an upper cavity of the MEMS device 110. The encasing member 216 may also serve to support a cap structure that may be subsequently formed over the MEMS device 110. The encasing member 216, the sacrificial pillar 214, and the lower sacrificial member 106 may form an integral sacrificial structure that may be removable in a single etching step.

FIG. 3 illustrates a non-limiting process 300. The process 300 may include depositing a layer of third sacrificial material 318 such that the active region 104 may be covered with the third sacrificial material 318. The third sacrificial material 318 may include or consist of the same material as the first sacrificial material 130 and/or the second sacrificial material 230. The process 300 may result in forming spacer region(s) 320, which extend laterally out of the encasing member 216, over the active region 104 of the device area. The third sacrificial material 318 may also be deposited at least substantially vertically above the electrical contact points 112a and 112b.

FIG. 4 illustrates a non-limiting process 400. The process 400 may include etching the layer of third sacrificial material 318 using a second mask. The process 400 may remove the third sacrificial material 318 at only one of the spacer region(s) 320, to form an indentation 420. The indentation 420 may expose the underlying active region 104. The indentation 420 may serve to receive an anchor of a cap structure subsequently. The process 400 may also remove part of the material of the active region 104, causing the active region 104 to recede. The process 400 may also remove the third sacrificial material 318 above the upper electrical contact point 112a, to form an upper contact via 422. The upper contact via 422 may expose the upper electrical contact point 112a. In other words, the indentation 420 and the upper contact via 422 may be formed at the same time, in a single process, using the same etching mask.

FIG. 5 illustrates a non-limiting process 500. The process 500 may include etching the layer of third sacrificial material 318, together with part of the wafer, using a third mask. The process 500 may form a lower contact via 524 by removing the third sacrificial material 318 and part of the active region 104 that lies at least substantially vertically above the lower electrical contact point 112b. The lower contact via 524 may expose the lower electrical contact point 112b.

FIG. 6 illustrates a non-limiting process 600. The process 600 may include depositing a metal layer 630 over the third sacrificial material 318, as well as areas of the device wafer 140 and the electrical contact points 112a, 112b that are exposed. The metal layer 630 may be a homogenous layer formed from a single metal, for example Al, Cu, or combinations thereof, in a non-limiting embodiment. The metal layer 630 may extend into the indentation 420, to form an anchor 620. The metal layer 630 may cover the other spacer region(s) 320 that does not have an indentation. The metal layer 630 may also at least substantially coat the encasing member 216. The metal layer 630 may also extend into, and coat the walls of each of the upper contact via 422 and the lower contact via 524. The metal layer 630 may also coat the exposed surfaces of each of the upper electrical contact point 112a and the lower electrical contact point 112b.

Figure 7:
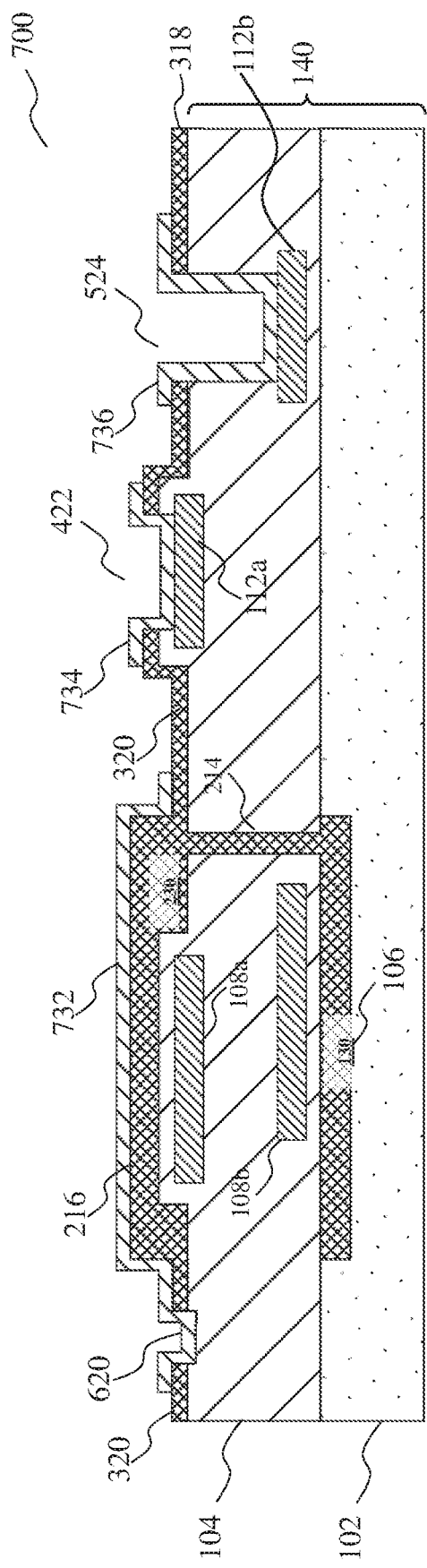

FIG. 7 illustrates a non-limiting process 700. The process 700 may include etching the metal layer 630 using a fourth mask. The process 700 may include patterning the metal layer 630. After the patterning of the metal layer 630, the previously contiguous metal layer 630 is separated into several members, including a metal cap 732, an upper electrical contact pad 734 and a lower electrical contact pad 736. The process 700 may remove the metal layer 630 that lies above the spacer region(s) 320 that does not have an indentation, so that the spacer region(s) 320 is exposed. The process 700 may also separate the metal layer 630 in contact with the upper electrical contact point 112a from the metal layer 630 in contact with the lower electrical contact point 112b. The metal cap 732 may conform to the shape of the encasing member 216. The metal cap 732 may at least partially envelope the encasing member 216. The metal cap 732 may be anchored to the device wafer 140 only at one side, at the anchor 620. The metal cap 732 may be unanchored to the device wafer 140, above another spacer region(s) 320. The upper electrical contact pad 734 and the lower electrical contact pad 736 may be part of the redistribution layer (RDL) of the device wafer 140.

Figure 8:
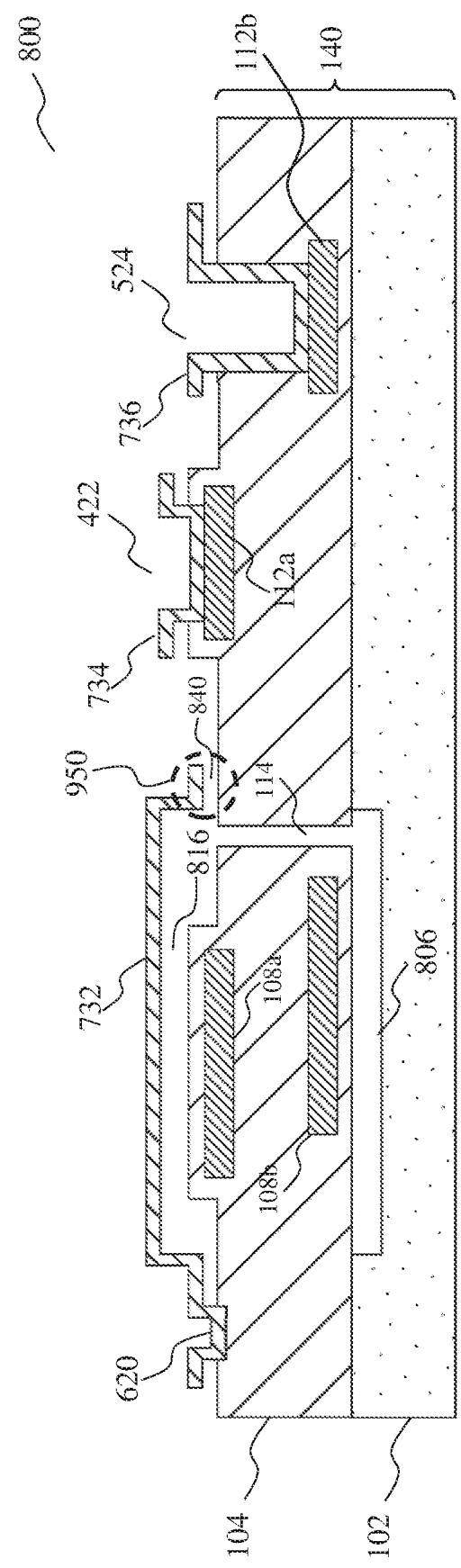

FIG. 8 illustrates a non-limiting process 800. The process 800 may include removing the first sacrificial material 130, the second sacrificial material 230 and the third sacrificial material 318 by etching in a non-limiting embodiment. The encasing member 216, the sacrificial pillar 214 and the lower sacrificial member 106 may be released through a gap 840 between the metal cap 732 and the device wafer 140. The gap 840 may be laterally offset from the device area. The metal cap 732 may include an extension member that forms a lateral channel 950 with the device wafer 140, and the gap 840 may be an opening to the lateral channel 950. An upper cavity 816 may be formed between the MEMS device 110 and the metal cap 732 after removal of the encasing member 216. A lower cavity 806 may be formed between the MEMS device 110 and the substrate 102 after removal of the lower sacrificial member 106. A vertical via 114 may be formed after removal of the sacrificial pillar 214.

Figure 9:
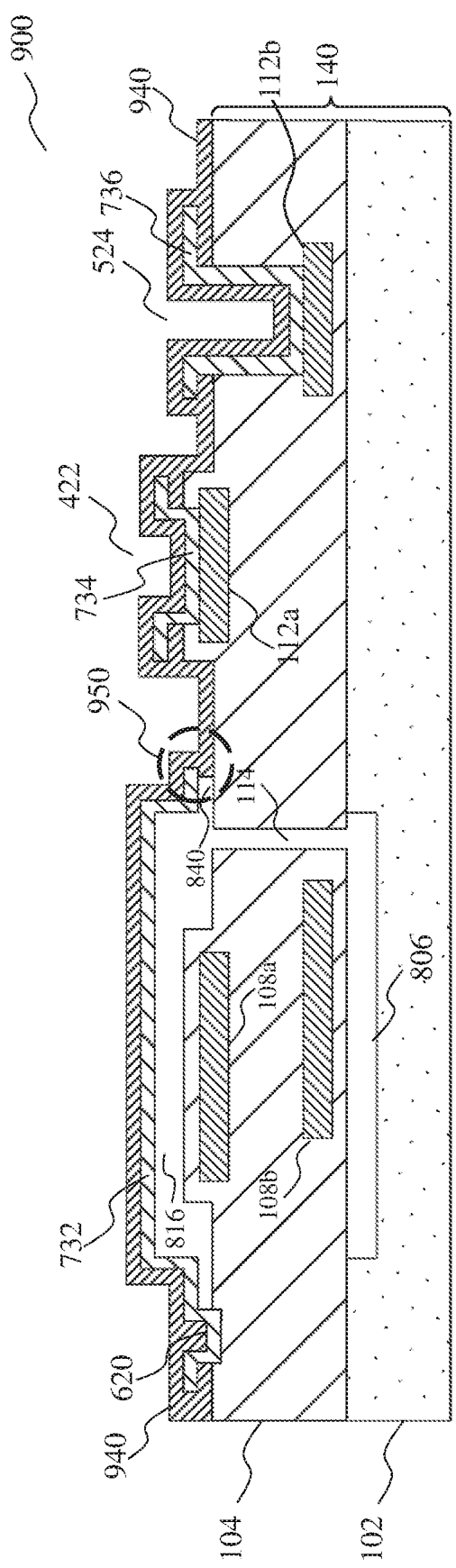

FIG. 9 illustrates a non-limiting process 900. The process 900 may include depositing a sealing layer 940. The sealing layer 940 may seal the gap 840, thereby encapsulating the MEMS device 110 under the metal cap 732. The sealing layer 940 may overlay the entire top surface of the device wafer 140, such that the metal cap 732, the anchor 620, the upper electrical contact pad 734, the lower electrical contact pad 736, and exposed portions of the active region 104 are all coated with the sealing layer 940. The sealing layer 940 may also reach into the upper contact via 422 and the lower contact via 524, to coat the walls of each of these contact vias. The sealing layer 940 may also serve as a passivation layer. The sealing layer 940 may include a protective material, such as an oxide or nitride, such as but not limited to silicon dioxide, silicon nitride, or a combination thereof (e.g. a sealing layer having a multi-layered combination). The sealing layer 940 may include the same material as any one of the first sacrificial material 130, the second sacrificial material 230, or the third sacrificial material 318.

Figure 10:
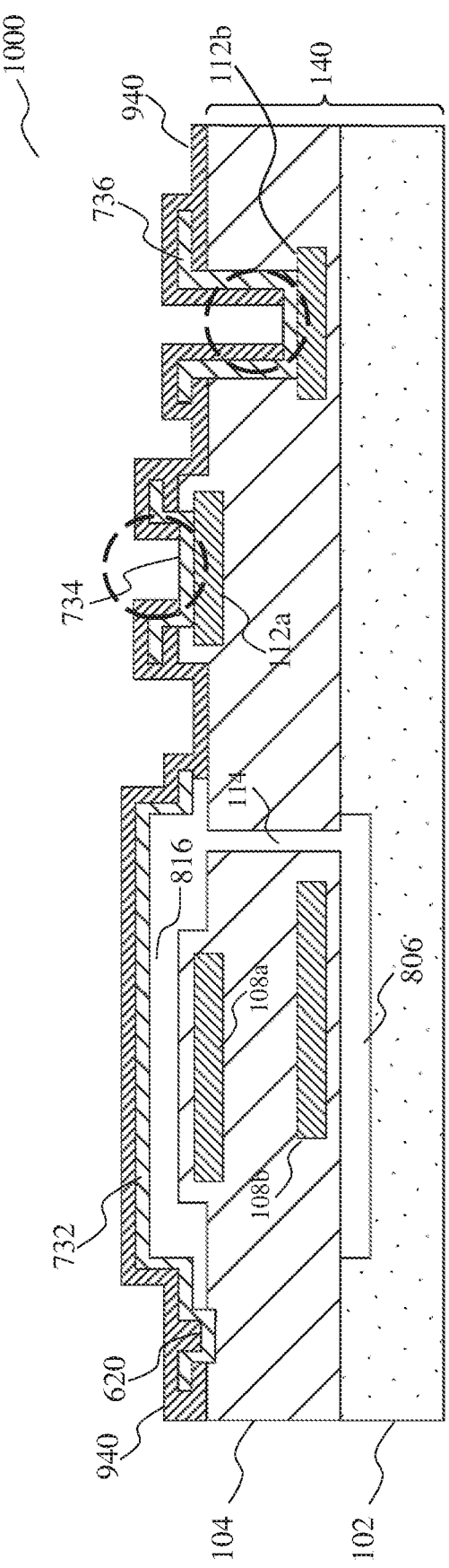

FIG. 10 illustrates a non-limiting process 1000. The process 1000 may include etching the sealing layer 940 using a fifth mask to open the electrical contact pads, i.e. to expose the upper electrical contact pad 734 and the lower electrical contact pad 736. The MEMS device 110 may be electrically coupled to external devices or circuits through the upper electrical contact pad 734 and the lower electrical contact pad 736.

Figure 11:
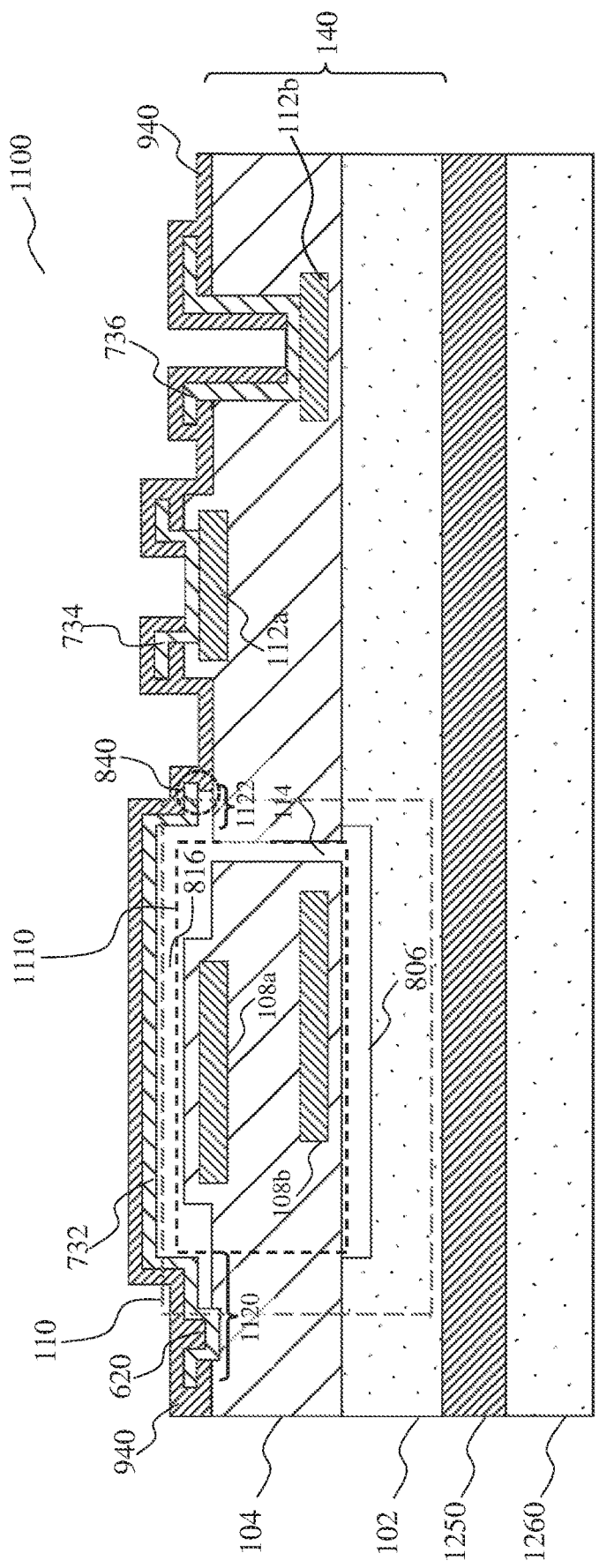
FIG. 11 illustrates a simplified cross-sectional view of a MEMS package according to various non-limiting embodiments.

FIG. 11 illustrates a simplified cross-sectional view of a MEMS package 1100 according to various non-limiting embodiments. The MEMS package 1100 may include the end product of the processes 100 to 1000. The MEMS package may include the device wafer 140, the metal cap 732, the sealing layer 940, the upper electrical contact pad 734 and the lower electrical contact pad 736. The MEMS package 1100 may further include an oxide layer 1250 under the device wafer 140, and a further substrate 1260 under the oxide layer 1250. The oxide layer 1250 may serve as an insulator. The substrate 102 may include silicon such that the device wafer 140 may be a silicon-on-insulator (SOI) wafer.

The device wafer 140 may include a MEMS device 110 in a device area. The MEMS device 110 may include an active element 1110. The active element 1110 may include the upper electrode 108a and the lower electrode 108b. The active element 1110 may further include a transducer material, for example, a piezoelectric material, between the upper electrode 108a and the lower electrode 108b. The device area may include a lower cavity 806 under the active element 1110 and an upper cavity 816 above the active element 1110. The upper cavity 816 and the lower cavity 806 may be connected through a vertical cavity, herein referred to as the vertical via 114. The MEMS device 110 may be partially encapsulated by a metal cap 732. The metal cap 732 may be partially anchored to the device wafer 140. The metal cap 732 may include an anchored portion, i.e. a part of the metal cap 732 that is anchored to the device wafer 140, as well as an unanchored portion, i.e. a part of the metal cap 732 that is not anchored to the device wafer 140. The metal cap 732 may include a first extension member 1120 that includes an anchor 620. The first extension member 1120 may extend laterally away from the MEMS device 110 in a first direction, and extend towards the device wafer 140. The portion of the first extension member 1120 that extends towards the device wafer 140 may be referred to as an anchor 620. The first extension member 1120 may be secured to the device wafer 140 at the anchor 620. The anchor 620 may be partially embedded into the device wafer 140, at the active region 104. The metal cap 732 may include a second extension member 1122. The second extension member 1122 may extend laterally away from the MEMS device 110 in a direction different from the first direction. The second extension member 1122 may hang above the device wafer 140 such that a gap 840 exists between the second extension member 1122 and the device wafer 140. The gap 840 may serve as a release via for removing sacrificial material that defined the areas for the lower cavity 806, the upper cavity 816, and the vertical via 114. The gap 840 may be laterally offset relative to the MEMS device 110. In other words, the gap 840 may not be positioned directly above the MEMS device 110. The gap 840 may be a side opening that leads to the upper cavity 816. The second extension member 1122 may define a lateral channel with respect to the device wafer 140. A first end of the lateral channel opens to the upper cavity 816, while a second end of the lateral channel is closed up by the sealing layer 940 which is uniformly spread across the entire top surface of the device wafer 140 and over the metal cap 732. The sealing layer 940 may have the same thickness across the device wafer 140. The sealing layer 940 may be the topmost layer of the MEMS package 1100, thereby sealing and passivating the device wafer 140. The second end, which is also referred herein as the gap 840, may oppose the first end of the lateral channel. As the release via is a lateral channel, the area of the device wafer 140 available for the MEMS device 110 may be maximized, unlike a vertical release via where the area of the device wafer 140 directly underneath the vertical release via may be unusable space. As such, the footprint of the MEMS package may be reduced.

The metal cap 732, together with the sealing layer 940, may fully encapsulate the MEMS device 110, including both the upper cavity 816 and the lower cavity 806. The overall thickness of the MEMS package 1100 may be less than 200 um, for example in a range of 100 um to 150 um, which is substantially thinner than MEMS packages fabricated by wafer-level capping. The slim form factor of the MEMS package 1100 may be achievable as the encapsulation layers consisting of the metal cap 732 and the sealing layer 940 are thinner than a cap wafer. Also, the metal cap 732 may shield the MEMS device 110 from EM interferences and as such, it is unnecessary to include a separate EM shielding structure within the MEMS package 1100, further reducing the thickness of the MEMS package 1100. The metal cap 732 also lies within the same layer as the RDL by virtue of being formed in the same process step. The metal cap 732, the upper electrical contact pad 734 and the lower electrical contact pad 736 may be identical in composition, as well as thickness, by virtue of being formed from the same metal layer 630, in the same process step.

Figure 12A:
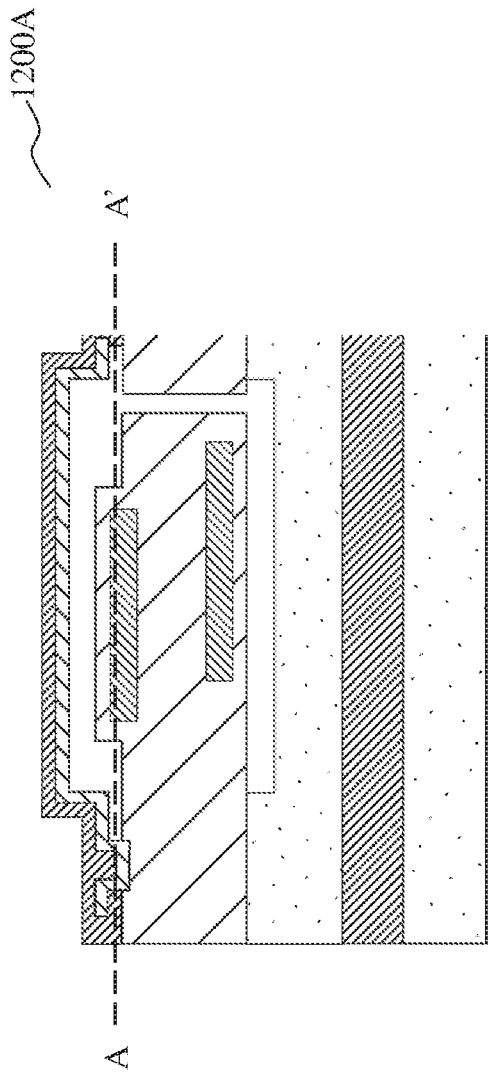
FIG. 12A illustrates a partial cross-sectional view of the MEMS package of FIG. 11.

FIG. 12A illustrates a partial cross-sectional view 1200A of the MEMS package 1100. The line AA' indicates a cut across the MEMS package 1100.

Figure 12B:
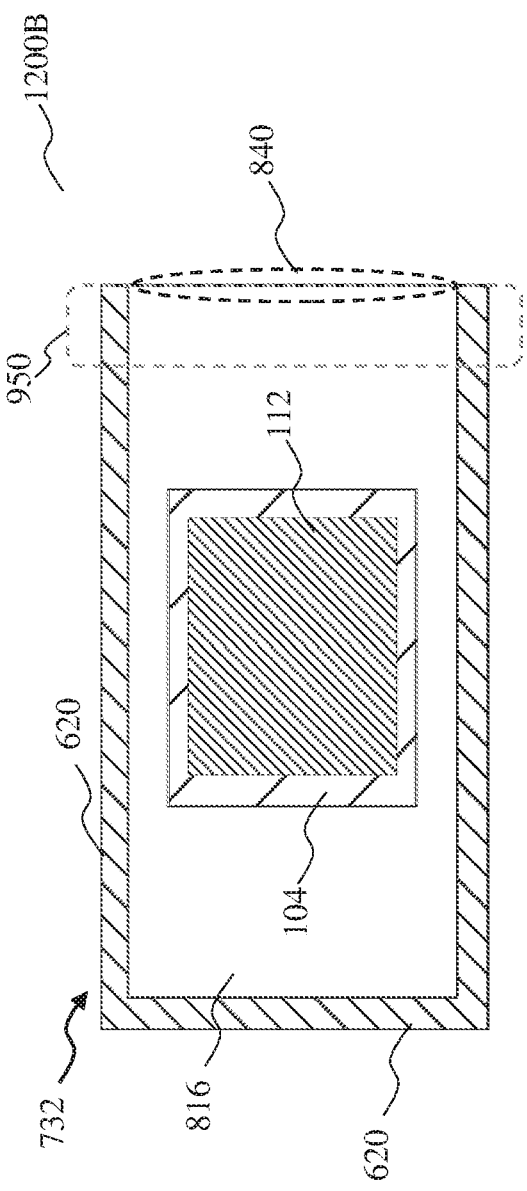
FIG. 12B illustrates a partial top view of a metal cap of a MEMS package according to various non-limiting embodiments.

FIG. 12B illustrates a partial top view 1200B of the metal cap 732, when the MEMS package 1100 is cut across the line AA' shown in FIG. 12A. The partial top view 1200B shows only the device area of the MEMS package 1100. The metal cap 732 may be anchored to the device wafer 140 along part of a periphery of the device area. In other words, the anchor 620 of the metal cap 732 may form a partial perimeter around the MEMS device 110. The metal cap 732 may be unanchored to the device wafer 140 at an unanchored region, also referred herein as the lateral channel 950. The lateral channel 950 may include two open ends, one leading to the upper cavity 816 and the open end leading to the gap 840 which is sealed by the sealing layer 940.

According to various non-limiting embodiments, a MEMS package may include a wafer, a metal cap, an electrical contact pad and a sealing layer. The wafer may include a MEMS device. The metal cap may be at least partially anchored to the wafer where at least one point between the cap and the wafer may be unanchored. The metal cap may at least substantially extend over the MEMS device. The electrical contact pad may be electrically coupled to the MEMS device. The sealing layer may be disposed over the metal cap and the wafer. The sealing layer may be uniform in thickness of the metal cap and the wafer. The sealing layer may seal a gap between an unanchored portion of the metal cap and the wafer, to encapsulate the MEMS device. The MEMS package may include an upper cavity between the metal cap and the MEMS device. The MEMS package may include a lower cavity at a lower surface of the MEMS device. The lower surface may oppose an upper surface of the MEMS device. The upper surface may face the metal cap. The upper surface of the MEMS device may have an indentation. The metal cap may be anchored to the wafer at the indentation. The unanchored portion of the metal cap may extend beyond the MEMS device. The electrical contact pad and the metal cap may include the same composition, and may also have the same thickness.

In other words, according to various non-limiting embodiments, a MEMS package may include, or may be the MEMS package 1100. The MEMS package may include a wafer, a metal cap, an electrical contact pad and a sealing layer. The wafer may include, or may be the device wafer 140. The metal cap may include, or may be the metal cap 732. The electrical contact pad may include, or may be, the upper electrical contact pad 734 and/or the lower electrical contact pad 736. The sealing layer may include, or may be, the sealing layer 940. The metal cap may at least substantially overhang the MEMS device, so as to shield the MEMS device from EM waves. The metal cap may also provide structural strength to the thin film encapsulation of the MEMS device. The thin film encapsulation may include the metal cap and the sealing layer. The metal cap may not fully encapsulate the MEMS device, as a release via may be required, to release sacrificial material in order to form cavities within the MEMS device. The sealing layer may overlay the metal cap and may be fully anchored to the wafer, so as to hermetically seal the MEMS device and the cavities. The cavities may include an upper cavity above a moveable element of the MEMS device and a lower cavity below the moveable element. The electrical contact pad(s) may be part of a RDL. The electrical contact pad(s) may be formed in the same layer as the metal cap, such that the electrical contact pad(s) and the metal cap may be identical in composition, and possibly identical in thickness.

FIG. 13 illustrates a flow diagram 1300 of a method for packaging a MEMS device according to various non-limiting embodiments. The MEMS device may be, for example, the MEMS device 110. The method may include providing a metal cap that is partially anchored to a wafer that includes the MEMS device. At least one point between the cap and the wafer may be unanchored. The metal cap may be the metal cap 732. The wafer may be the device wafer 140. The metal cap may be arranged to at least substantially extend over the MEMS device. Element 1302 may include providing a sacrificial structure on the wafer. Providing the sacrificial structure may include depositing a first layer of sacrificial material over the wafer and etching the first layer of sacrificial material to form an encasing member, which may include process 200. Providing the sacrificial structure may further include depositing a second layer of sacrificial material to form a spacer region(s), which may include process 300. Providing the sacrificial structure may further include etching the second layer of sacrificial material to expose the wafer at one side of the MEMS device, which may include process 400. The metal cap may be anchored to the wafer at the one side of the MEMS device where the wafer is exposed. The process 400 may also expose an electrical contact pad that is electrically coupled to the MEMS device. The sacrificial structure may include the encasing member to encase the MEMS device. The sacrificial structure may include the spacer region(s) recessed relative to the encasing member. The spacer region(s) may extend out of the encasing member. The spacer region(s) may be laterally offset from the MEMS device. The encasing member may be the encasing member 216. The spacer region(s) may be the spacer region(s) 320. Element 1302 may further include depositing a metal layer over the sacrificial structure and the wafer, and etching the metal layer using a single etch mask to form the metal cap, an electrical contact pad and an opening over the spacer region(s). In other words, the element 1302 may include process 600. The metal layer may be the metal layer 600. The electrical contact pad may include the upper electrical contact 734 and/or the lower electrical contact 736. The method may further include forming an upper cavity between the metal cap and the MEMS device by releasing the sacrificial material through the opening, which may include process 800. The upper cavity may be the upper cavity 816. The method may further include providing a further sacrificial material between the MEMS device and a substrate of the wafer. The further sacrificial material may be the first sacrificial material 130 of the lower sacrificial member 106. The method may further include releasing the further sacrificial material through the opening to form a lower cavity between the MEMS device and the substrate. The lower cavity may be the lower cavity 806.

The method may further include electrically coupling an electrical contact pad to the MEMS device. Element 1304 may include process 600. The electrical contact pad may include the upper electrical contact pad 734 and/or the lower electrical contact pad 736. The method may further include providing a sealing layer over the metal cap and the wafer such that the sealing layer seals a gap between an unanchored portion of the metal cap and the wafer to encapsulate the MEMS device. The sealing layer may be the sealing layer 940. Element 1306 may include process 900. Element 1306 may include depositing a passivation material over the metal cap, the wafer and the electrical contact pad. Element 1306 may also include etching the passivation material to expose the electrical contact pad, which may include process 1000. The unanchored portion of the metal cap may be at least partially formed over the spacer region(s). The electrical contact pad and the metal cap may include the same composition. The method may include forming the electrical contact pad and the metal cap in the same metal layer and as such, the electrical contact pad and the metal cap may also have the same thickness.

The following examples pertain to further embodiments.

Example 1 is a MEMS package including a wafer having a MEMS device; a metal cap partially anchored to the wafer where at least one point between the cap and the wafer is unanchored, the metal cap at least substantially extending over the MEMS device; an electrical contact pad electrically coupled to the MEMS device; and a sealing layer disposed over the metal cap and the wafer, such that the sealing layer seals a gap between an unanchored portion of the metal cap and the wafer to encapsulate the MEMS device; wherein the electrical contact pad and the metal cap include the same composition.

In example 2, the subject-matter of example 1 can optionally include that the unanchored portion of the metal cap extends beyond the MEMS device.

In example 3, the subject-matter of example 1 or example 2 can optionally include that the MEMS package includes an upper cavity between the metal cap and the MEMS device.

In example 4, the subject-matter of any one of examples 1 to 3 can optionally include that the MEMS package includes a lower cavity at a lower surface of the MEMS device, the lower surface opposing an upper surface of the MEMS device facing the metal cap.

In example 5, the subject-matter of any one of examples 1 to 4 can optionally include that an upper surface of the MEMS device facing the metal cap has an indentation, wherein the metal cap is anchored to the wafer at the indentation.

In example 6, the subject-matter of any one of examples 1 to 5 can optionally include that the electrical contact pad and the metal cap are identical in thickness.

Example 7 is a method for packaging a MEMS device. The method may include providing a metal cap that is partially anchored to a wafer including the MEMS device where at least one point between the cap and the wafer is unanchored, the metal cap arranged to at least substantially extend over the MEMS device; electrically coupling an electrical contact pad to the MEMS device; and providing a sealing layer over the metal cap and the wafer such that the sealing layer seals a gap between an unanchored portion of the metal cap and the wafer to encapsulate the MEMS device; wherein the electrical contact pad and the metal cap include the same composition.

In example 8, the subject-matter of example 7 can optionally include that providing the metal cap includes: providing a sacrificial structure on the wafer, the sacrificial structure including an encasing member to encase the MEMS device and one or more spacer regions recessed relative to the encasing member, wherein the one or more spacer regions extend out of the encasing member; depositing a metal layer over the sacrificial structure and the wafer; and etching the metal layer using a single etch mask, to form the metal cap, the electrical contact pad, and an opening over the one or more spacer regions.

In example 9, the subject-matter of example 8 can optionally include that the spacer region is laterally offset from the MEMS device.

In example 10, the subject-matter of example 8 or example 9 can optionally include that providing the sacrificial structure includes: depositing a first layer of sacrificial material over the wafer; etching the first layer of sacrificial material to form the encasing member; depositing a second layer of sacrificial material to form the one or more spacer regions; and etching the second layer of sacrificial material to expose the wafer at one side of the MEMS device.

In example 11, the subject-matter of example 10 can optionally include that etching the second layer of sacrificial material also exposes one or more electrical contact points of the MEMS device.

In example 12, the subject-matter of example 10 or example 11 can optionally include that the metal cap is anchored to the wafer at the one side of the MEMS device where the wafer is exposed.

In example 13, the subject-matter of any one of examples 8 to 12 can optionally include that the unanchored portion of the metal cap is at least partially formed over the one or more spacer regions.

In example 14, the subject-matter of any one of examples 8 to 13 can optionally include: forming an upper cavity between the metal cap and the MEMS device by releasing the sacrificial material through the opening.

In example 15, the subject-matter of any one of examples 8 to 14 can optionally include: providing a further sacrificial material between the MEMS device and a substrate of the wafer; and forming a lower cavity between the MEMS device and the substrate by releasing the further sacrificial material through the opening.

In example 16, the subject-matter of any one of examples 7 to 15 can optionally include that providing the sealing layer includes: depositing a passivation material over the metal cap, the wafer, and the electrical contact pad; and etching the passivation material to expose the electrical contact pad.

In example 17, the subject-matter of any one of examples 7 to 16 can optionally include that the electrical contact pad and the metal cap are identical in thickness.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A microelectromechanical systems (MEMS) package comprising:
   a wafer having a MEMS device area and a contact area;
   at least one electrode disposed in the MEMS device area and separated from a substrate of the wafer;
   a metal cap partially anchored to the wafer where at least one point between the cap and the wafer is unanchored, the metal cap at least substantially extending over the MEMS device area;
   an electrical contact pad disposed in the contact area and electrically coupled to the MEMS device area; and
   a sealing layer disposed over the metal cap and the wafer, such that the sealing layer seals a gap between an unanchored portion of the metal cap and the wafer to encapsulate the MEMS device area;
   wherein the electrical contact pad and the metal cap comprise the same composition.

2. The MEMS package of claim 1, wherein the unanchored portion of the metal cap extends beyond the MEMS device area.

3. The MEMS package of claim 1, wherein the MEMS package comprises an upper cavity between the metal cap and the at least one electrode.

4. The MEMS package of claim 1, wherein the MEMS package comprises a lower cavity between the substrate and the at least one electrode of the MEMS device area.

5. The MEMS package of claim 1, wherein the MEMS device area comprises a MEMS device, and an upper surface of the MEMS device facing the metal cap has an indentation, wherein the metal cap is anchored to the wafer at the indentation.

6. The MEMS package of claim 1, wherein the electrical contact pad and the metal cap are formed from the same layer.

7. The MEMS package of claim 1, wherein the at least one electrode comprises a first electrode and a second electrode, and the MEMS device area comprises a piezoelectric film disposed between the first electrode and the second electrode.

8. The MEMS package of claim 7, wherein the piezoelectric film comprises at least aluminum nitride (AlN), scandium-doped AlN (ScAlN), lithium niobate (LiNbO$_3$), lithium tantalate (LiTa$_2$O$_3$), zinc oxide (ZnO), lead zirconate titanate (PZT), polyvinylidene fluoride (PVDF) or combinations thereof.

9. The MEMS package of claim 1, further comprising a vertical via between the MEMS device area and the contact area.

* * * * *